United States Patent
Lin et al.

(10) Patent No.: US 9,218,853 B2
(45) Date of Patent: Dec. 22, 2015

(54) CONTROL METHOD FOR NONVOLATILE MEMORY DEVICE WITH VERTICALLY STACKED STRUCTURE

(71) Applicant: LITE-ON TECHNOLOGY CORPORATION, Taipei (TW)

(72) Inventors: Chrong-Jung Lin, Hsinchu (TW); Hsin-Wei Pan, Hsinchu (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 14/227,331

(22) Filed: Mar. 27, 2014

(65) Prior Publication Data

US 2015/0187398 A1    Jul. 2, 2015

(30) Foreign Application Priority Data

Dec. 30, 2013    (CN) .......................... 2013 1 0744294

(51) Int. Cl.
| | |
|---|---|
| *G11C 7/00* | (2006.01) |
| *G11C 7/22* | (2006.01) |
| *G11C 5/02* | (2006.01) |
| *G11C 7/18* | (2006.01) |
| *G11C 7/12* | (2006.01) |
| *G11C 7/14* | (2006.01) |

(52) U.S. Cl.
CPC .. *G11C 5/02* (2013.01); *G11C 7/12* (2013.01); *G11C 7/14* (2013.01); *G11C 7/18* (2013.01)

(58) Field of Classification Search
CPC .................................. G11C 5/02; G11C 7/18
USPC ........... 365/189.011, 185.11, 185.02, 185.18, 365/185.17
See application file for complete search history.

(56) References Cited

U.S. PATENT DOCUMENTS

| | | | |
|---|---|---|---|
| 8,278,170 B2 | 10/2012 | Lee et al. | |
| 2011/0199825 A1* | 8/2011 | Han et al. | 365/185.11 |
| 2012/0051143 A1* | 3/2012 | Yoon et al. | 365/185.22 |
| 2012/0268988 A1* | 10/2012 | Seol et al. | 365/185.03 |
| 2012/0327715 A1* | 12/2012 | Lee et al. | 365/185.17 |
| 2013/0007353 A1* | 1/2013 | Shim et al. | 711/103 |
| 2013/0094294 A1* | 4/2013 | Kwak et al. | 365/185.03 |

* cited by examiner

*Primary Examiner* — Toan Le
(74) *Attorney, Agent, or Firm* — WPAT, PC; Justin King

(57) ABSTRACT

A control method for a nonvolatile memory device with a vertically stacked structure is provided. The nonvolatile memory device includes a substrate, a common source line formed on the substrate, and plural memory blocks disposed over the substrate. Each memory block includes a cell string connected between a bit line and the common source line. Firstly, a first memory block of the plural memory blocks is selected as an active memory block, and one of the remaining memory blocks is selected as a second memory block. Then, a ground voltage is provided to the bit line of the second memory block, and the cell string of the second memory block is conducted, so that the ground voltage is transmitted from the bit line to the common source line through the cell string.

6 Claims, 6 Drawing Sheets

| | Erase | Program | Read |
|---|---|---|---|
| Selected word line | Ground voltage Vss | Program voltage Vpgm (Vpgm=15~20V) | Selected read voltage |
| Non-selected word line | Ground voltage Vss | Pass voltage Vpass (Vpass=10V) | Non-selected read voltage 4.5V |
| Dummy word line (DWL) | Intermediate voltage VDWL (Vss<VDWL<Ver) | Intermediate voltage VDWL (Vss<VDWL<Ver) | Intermediate voltage VDWL (Vss<VDWL<Ver) |
| Upper selection line (USL) | Floating | Power supply voltage Vcc | Turn-on voltage 4.5V |
| Lower selection line (LSL) | Floating | Ground voltage Vss | Turn-on voltage 4.5V |
| Common source line (CSL) | Floating | Ground voltage Vss | Ground voltage Vss |
| Selected bit line | Floating | Ground voltage Vss | Power supply voltage Vcc |
| Non-selected bit line | Floating | Power supply voltage Vcc | Low voltage (0.8V) |
| Substrate | Erase voltage Ver (Ver=21V) | Ground voltage Vss | Ground voltage Vss |

FIG. 3 (PRIOR ART)

CONTROL METHOD FOR NONVOLATILE MEMORY DEVICE WITH VERTICALLY STACKED STRUCTURE

This application claims the benefit of People's Republic of China Application Serial No. 201310744294.4, filed Dec. 30, 2013, the subject matter of which is incorporated herein by reference.

FIELD OF THE INVENTION

The present invention relates to a nonvolatile memory device, and more particularly to a control method for a nonvolatile memory device with a vertically stacked structure.

BACKGROUND OF THE INVENTION

FIG. 1 is a schematic cross-sectional view illustrating a conventional nonvolatile memory device with a vertically stacked structure. For example, this nonvolatile memory device is disclosed in U.S. Pat. No. 8,278,170.

A common source line CSL is formed on a semiconductor substrate 100. The common source line CSL is an N-type doping region of the semiconductor substrate 100. Lower interlayer dielectric layers 111~114 and lower conduction patterns LSL, WL0 and WL1 are alternately stacked on the semiconductor substrate 100.

Moreover, lower active pillars 136 run through the lower interlayer dielectric layers 111~114 and the lower conduction patterns LSL, WL0 and WL1. In addition, the lower active pillars 136 are contacted with the semiconductor substrate 100. The inside of the lower active pillar 136 may be filled with a lower filling insulating layer 138.

Moreover, upper interlayer dielectric layers 151~154 and upper conduction patterns DWL, WL2, WL3 and USL are alternately stacked on the uppermost lower interlayer dielectric 114.

Moreover, upper active pillars 164 run through the upper interlayer dielectric layers 151~154 and the upper conduction patterns DWL, WL2, WL3 and USL and contact the lower active pillars 136. In addition, the upper active pillars 164 are contacted with the lower active pillars 136. The inside of the upper active pillars 164 may be filled with an upper filling insulating layer 166.

An information storage layer 171 is arranged between the active pillars 136 and 164 and the conductions patterns LSL, WL0~WL3 and USL. The information storage layer 171 may be extended between the conduction patterns LSL, WL0~WL3 and USL and the interlayer dielectric layers 111~114 and 151~154.

An electrode separation pattern 175 is disposed over the common source line CSL. In addition, the electrode separation pattern 175 run through the interlayer dielectric layers 111~114 and 151~154 and the conduction patterns LSL, WL0~WL3 and USL. The bottom of the electrode separation pattern 175 is contacted with the semiconductor substrate 100.

An upper active pattern 177 is disposed on the upper filling insulating layer 166 and contacted with an inner side of the upper active pillars 164. The upper active pattern 177 and the upper part of the upper active pillars 164 may be doped with impurities in order to be collaboratively defined as a drain region 179.

Moreover, a bit line BL1 is disposed over the upper interlayer dielectric layer 154, the electrode separation pattern 175 and the drain region 179. Generally, plural cell strings (CSTR) are formed between the bit line BL1 and the semiconductor substrate 100. In FIG. 1, only two cell strings (CSTR) are shown.

FIG. 2 is a schematic equivalent circuit illustrating a conventional nonvolatile memory device with vertically stacked cell strings structure. The nonvolatile memory device comprises bit lines BL0~BL2, word lines WL0~WL3, a dummy word line DWL, an upper selection line USL, a lower selection line LSL, and plural common source lines CSL.

Moreover, plural cell strings CSTR are connected between the bit lines BL0~BL2 and the common source lines CSL. Each of the cell string CSTR comprises a lower selection transistor LST, an upper selection transistor UST, plural memory cell transistors MCT and at least one dummy memory cell transistor DCT, which are connected with each other in series.

FIG. 3 is a table illustrating the operating voltages of the conventional nonvolatile memory device with a vertically stacked structure in different operating modes. In different operating modes, a control circuit (not shown) of the nonvolatile memory device may provide various voltages to corresponding lines.

For example, in an erase mode, an erase voltage Ver (21V) is provided to the semiconductor substrate 100, a ground voltage Vss is provided to all word lines WL0~WL3, the upper selection line USL, the lower selection line LSL, the common source lines CSL and all bit lines BL0~BL2 are floating, and an intermediate voltage VDWL is provided to the dummy word line DWL. The intermediate voltage VDWL is in the range between the ground voltage Vss and the erase voltage Ver.

In case that the memory cell transistor MCT corresponding to the word line one (WL1) and the bit line one (BL1) is intended to be programed in the program mode, the word line WL1 is the selected word line, and the other word lines (i.e. the word line zero (WL0), the word line two (WL2) and the word line three (WL3)) are non-selected word lines, the bit line one (BL1) is the selected bit line, and the other bit lines (i.e. the bit line zero (BL0) and the bit line two (BL2)) are non-selected bit lines.

In the program mode, a program voltage Vpam (15~20V) is provided to the selected word line, a pass voltage Vpass (10V) is provided to the non-selected word lines, a power supply voltage Vcc is provided to the upper selection line USL and the non-selected bit lines, the ground voltage Vss is provided to the lower selection line LSL, the common source lines CSL, the selected bit line and the semiconductor substrate 100, and the intermediate voltage VDWL is provided to the dummy word line DWL. The intermediate voltage VDWL is in the range between the ground voltage Vss and the erase voltage Ver.

In case that the memory cell transistor MCT corresponding to the word line two (WL2) and the bit line two (BL2) is intended to be read in the read mode, the word line two (WL2) is the selected word line, and the other word lines (i.e. the word line zero (WL0), the word line one (WL1) and the word line three (WL3)) are non-selected word lines, the bit line two (BL2) is the selected bit line, and the other bit lines (i.e. the bit line zero (BL0) and the bit line one (BL1)) are non-selected bit lines.

In the read mode, a selected read voltage (0V) is provided to the selected word line, a non-selected read voltage (4.5V) is provided to the non-selected word lines, a turn-on voltage (4.5V) is provided to both the upper selection line USL and the lower selection line LSL, the ground voltage is provided to the common source lines CSL and the semiconductor substrate 100, the power supply voltage Vcc is provided to the selected bit line, a low voltage (0.8V) is provided to the non-selected bit lines, and the intermediate voltage VDWL is provided to the dummy word line DWL. The intermediate voltage VDWL is in the range between the ground voltage Vss and the erase voltage Ver.

The voltages listed in the table of FIG. 3 are ideal operating voltages of the conventional nonvolatile memory device with a vertically stacked structure. However, since the common source line CSL is the N-type doping region of the semiconductor substrate, the electrical resistance of the common source line CSL is higher than the electrical resistance of the conductor of bit lines (e.g. BL0) or word lines (e.g. WL0). The voltage drifting caused by the electrical resistance of the common source line CSL may induce erroneous actions of the conventional nonvolatile memory device with the vertically stacked structure in various operating modes.

SUMMARY OF THE INVENTION

An embodiment of the present invention provides a control method for a nonvolatile memory device with a vertically stacked structure. The nonvolatile memory device includes a substrate, a common source line and plural memory blocks. The common source line is formed on the substrate. The plural memory blocks are disposed over the substrate. Each memory block includes a cell string connected between a bit line and the common source line. The control method includes the following steps. Firstly, a first memory block of the plural memory blocks is selected as an active memory block, and one of the remaining memory blocks is selected as a second memory block. Then, a ground voltage is provided to the bit line of the second memory block and the cell string of the second memory block is conducted, so that the ground voltage is transmitted from the bit line to the common source line of the substrate through the cell string.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 3 (prior art) is a table illustrating the operating voltages of the conventional nonvolatile memory device with a vertically stacked structure in various operating modes;

DETAILED DESCRIPTION OF PREFERRED EMBODIMENTS

Figure 1:
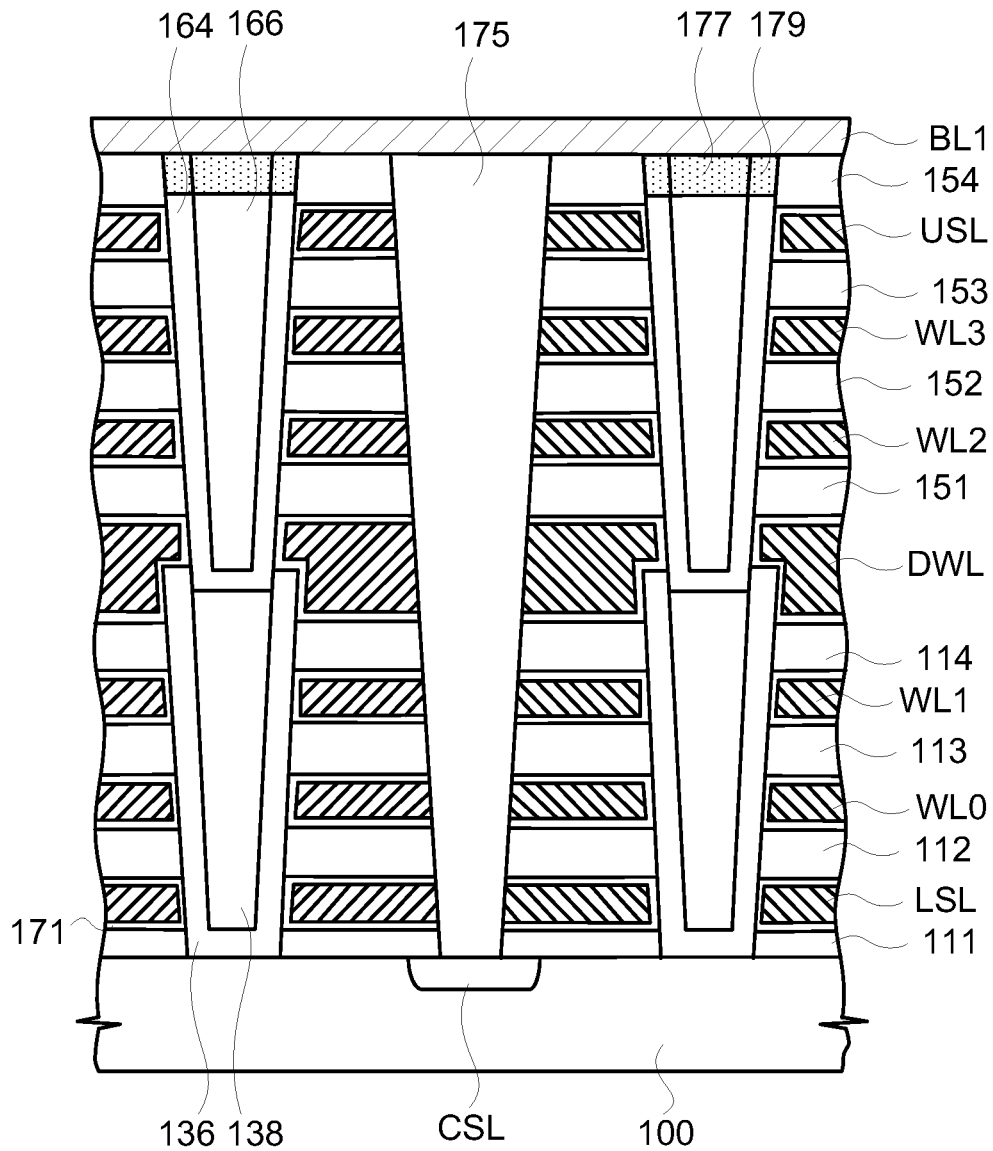
FIG. 1 (prior art) is a schematic cross-sectional view illustrating a conventional nonvolatile memory device with a vertically stacked structure.
Figure 2:
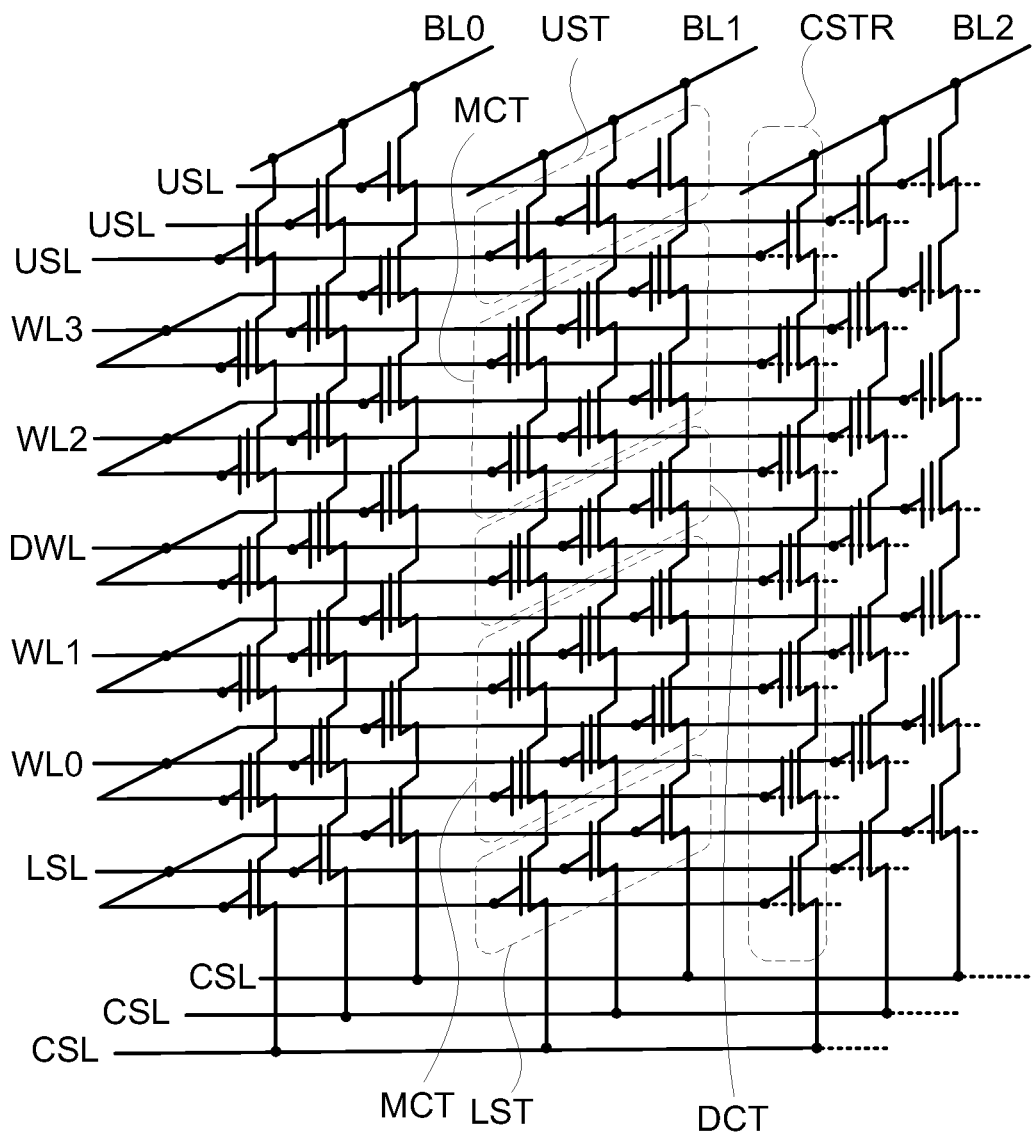
FIG. 2 (prior art) is a schematic equivalent circuit illustrating a conventional nonvolatile memory device with a vertically stacked structure.
Figure 4:
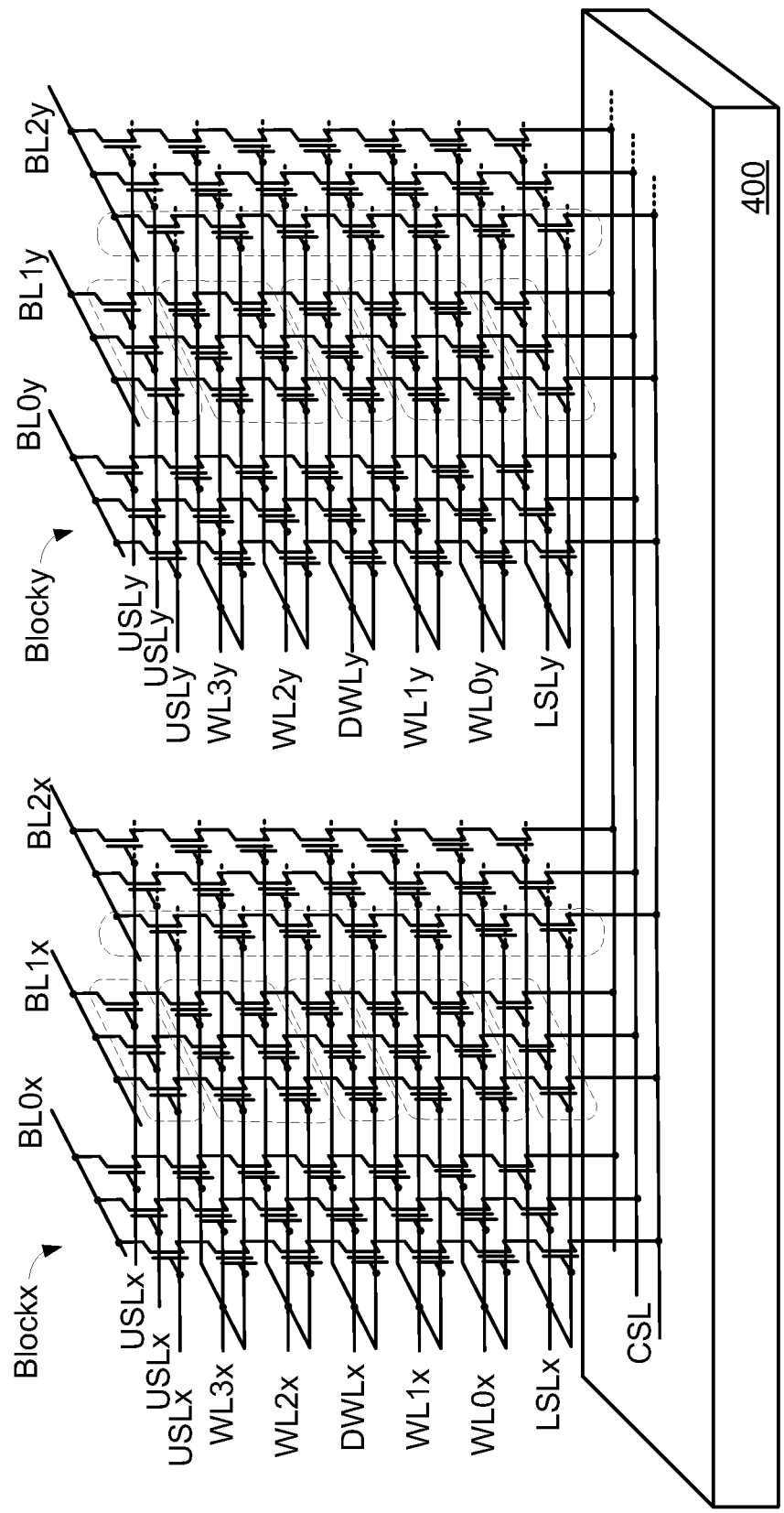
FIG. 4 schematically illustrates a nonvolatile memory device with a vertically stacked structure composed of plural memory blocks.

FIG. 4 schematically illustrates a nonvolatile memory device with a vertically stacked structure composed of plural memory blocks. As shown in FIG. 4, plural memory blocks are formed on a semiconductor substrate 400. Each memory block has the configurations as shown in FIG. 2. For example, as shown in FIG. 4, at least the x-th memory block Blockx and a y-th memory block Blocky are formed on the semiconductor substrate 400.

The x-th memory block Blockx comprises bit lines BL0x~BL2x, an upper selection line USLx, a lower selection line LSLx, word lines WL0x~WL3x, and a dummy word line DWLx.

Similarly, the y-th memory block Blocky comprises bit lines BL0y~BL2y, an upper selection line USLy, a lower selection line LSLy, word lines WL0y~WL3y, and a dummy word line DWLy.

The common source lines CSL between the x-th memory block Blockx and the y-th memory block Blocky are connected with each other through common source lines CSL. That is, the x-th memory block Blockx and the y-th memory block Blocky are connected with each other through the same common source lines CSL.

In case that the nonvolatile memory device is in a specified operating mode, only a memory block is active, but the other memory blocks are inactive. For example, when the x-th memory block Blockx is in the program mode, the control circuit (not shown) provides corresponding voltages to all lines of the x-th memory block Blockx in order to control the x-th memory block Blockx. Under this circumstance, the x-th memory block Blockx is active, and all lines of the x-th memory block Blockx are in the usage status.

That is, the bit lines BL0x~BL2x are in the usage status, the upper selection line USLx is in the usage status, the lower selection line LSLx is in the usage status, the word lines WL0x~WL3x are in the usage status, and the dummy word line DWLx is in the usage status. Moreover, the bit lines BL0x~BL2x in the usage status may be divided into a selected bit line and non-selected bit lines, and the word lines WL0x~WL3x in the usage status may be divided into a selected word line and non-selected word lines.

At the same time, the control circuit (not shown) does not provide active voltages to the y-th memory block Blocky, the y-th memory block Blocky is in an idle status. Consequently, the y-th memory block Blocky is inactive, and all lines of the y-th memory block Blocky are in the non-usage status.

Figure 5:
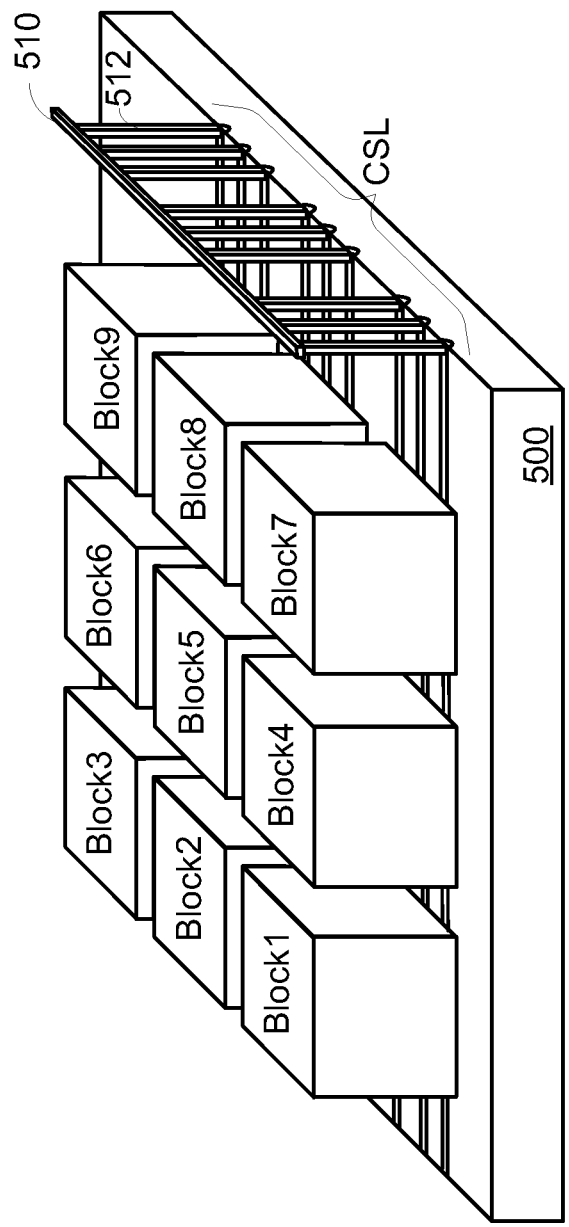
FIG. 5 schematically illustrates the connection of the plural memory blocks of the nonvolatile memory device through common source lines CSL.

FIG. 5 schematically illustrates the connection of the plural memory blocks of the nonvolatile memory device through common source lines CSL. As shown in FIG. 5, all of the memory blocks Block1~Block9 on the semiconductor substrate 400 are connected with the common source lines CSL. The operating principles of each of the memory blocks are similar to those shown in FIG. 2, and are not redundantly described herein.

Generally, the common source line CSL is an N-type doping region that is formed on a surface of the semiconductor substrate 400. For allowing the common source lines CSL to receive the voltages from the control circuit, plural conductor lines 512 are connected to the common source lines CSL through plural vias (not shown), and these conductor lines 512 are connected to a metal layer 510. Consequently, in various operating modes, corresponding voltages may be provided to the common source line CSL through the metal layer 510 and the conductor lines 512.

Since the common source line CSL is the N-type doping region of the semiconductor substrate 400, the internal resistance of the common source line CSL is higher. In other words, the conductivity of the common source line CSL is relatively lower, and the voltages at two terminals of the common source line CSL are usually not equal. Under this circumstance, there is a voltage drift between the two terminals of the common source line CSL.

For example, in the program mode and the read mode, it is necessary to provide the ground voltage Vss to the common source line CSL. Consequently, the ground voltage Vss is provided to the metal layer 510, and then transmitted to the common source line CSL (i.e. the N-type doping region of the semiconductor substrate 400) through the conductor lines 512. As shown in FIG. 5, the portion of the common source line CSL closer to the conductor lines 512 has the voltage closer to the ground voltage Vss, and the portion of the common source line CSL farther from the conductor lines 512 has a voltage drifted from the ground voltage Vss.

If the seventh memory block Block7 is active, the date error rate in the program mode or the read mode is lower because the voltage of the common source line CSL is closer to the ground voltage Vss. If the first memory block Block1 is active, the date error rate in the program mode or the read mode may be higher because the voltage of the common source line CSL is drifted from the ground voltage Vss.

As previously described, the voltage drifting generated by the electrical resistance of the common source line CSL may cause erroneous actions. For solving this drawback, the nonvolatile memory device of the present invention utilizes the inactive memory block to allow the common source line CSL to be connected to the ground voltage Vss throuth a lower resistance path.

Figure 6:
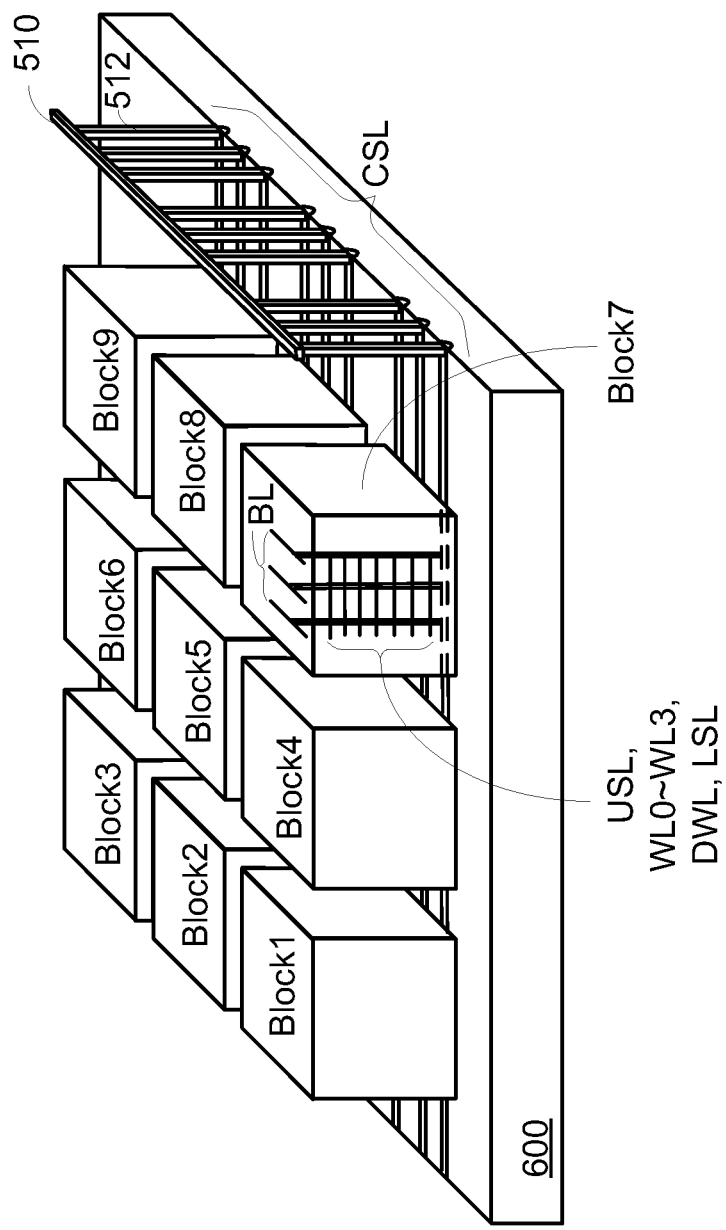
FIG. 6 schematically illustrates a method of controlling the connection of the plural memory blocks of the nonvolatile memory device through common source lines CSL according to an embodiment of the present invention.

FIG. 6 schematically illustrates a method of controlling the connection of the plural memory blocks of the nonvolatile memory device through common source lines CSL according to an embodiment of the present invention. In accordance with the control method of the present invention, the ground voltage Vss is provided to the non-usage bit lines of an inactive memory block near an active memory block in order to conduct the cell string (CSTR). Consequently, the ground voltage Vss is transmitted from the non-usage bit lines of the inactive memory block to the common source lines CSL through the cell string (CSTR).

For example, as shown in FIG. 6, the fourth memory block Block4 is an active memory block, and the neighboring seventh memory block Block7 is an inactive memory block. The control circuit (not shown) provides the ground voltage Vss to the non-usage bit lines of the seventh memory block Block7. In addition, appropriate bias voltages (e.g. a pass voltage or a turn-on voltage) are provided to the bit lines BL, the upper selection line USL, the lower selection line LSL, the word lines WL0~WL3 and the dummy word line DWL (e.g. the bias voltage is the intermediate voltage). Consequently, the cell string (CSTR) is conducted, and the ground voltage Vss is transmitted from the non-usage bit lines BL to the common source lines CSL through the cell string (CSTR). Under such control condition, Block7 provides a ground path to the common source lines CSL for Block4.

When the fourth memory block Block4 is the active memory block, the neighboring inactive memory block (e.g. Block7) could provide the ground voltage Vss path to the common source lines CSL as described before. Consequently, the voltage at the to the common source lines CSL of Block4 will not be drifted too much from the ground voltage Vss. Under this circumstance, the date error rate of the active memory block in the program mode or the read mode is largely reduced.

It is noted that the number of the inactive memory blocks to be conducted is not restricted. For example, if the fourth memory block Block4 is the active memory block, the cell strings of the first memory block Block1 and the seventh memory block Block7 may be simultaneously conducted to transmit the ground voltage Vss to the common source lines CSL.

Moreover, since the ground voltage Vss is transmitted to the common source lines CSL through the cell string of the inactive memory block, the metal layer 510 and the conductor lines 512 may be omitted. Under this circumstance, the layout area of the nonvolatile memory is saved.

From the above descriptions, the present invention provides a control method for a nonvolatile memory device with a vertically stacked structure. By conducting the cell string of the inactive memory block, the ground voltage Vss is transmitted to the common source lines CSL through the cell string. Consequently, the voltage at the common source lines CSL is stably close to the ground voltage Vss. In other words, the date error rate of the active memory block in the program mode or the read mode is largely reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A control method for a nonvolatile memory device with a vertically stacked structure, the nonvolatile memory device comprising a substrate, a common source line and plural memory blocks, the common source line being formed on the substrate, the plural memory blocks being disposed over the substrate, each memory block comprising a cell string connected between a bit line and the common source line, the control method comprising steps of:

selecting a first memory block of the plural memory blocks as an active memory block when the first memory block is in a program mode or a read mode, and selecting one of the remaining memory blocks as a second memory block, wherein the second memory block is inactive when the first memory block is in the program mode or the read mode; and providing a ground voltage to the bit line of the second memory block and conducting the cell string of the second memory block, so that the ground voltage is transmitted from the bit line to the common source line of the substrate through the cell string.

2. The control method as claimed in claim 1, wherein the second memory block further comprises plural control lines, wherein the plural control lines are connected to the cell string, and corresponding voltages are provided to the plural control lines to conduct the cell string.

3. The control method as claimed in claim 2, wherein the plural control lines comprise an upper selection line, plural words lines and a lower selection line.

4. The control method as claimed in claim 2, wherein a pass voltage or a turn-on voltage is provided to the plural control lines to conduct the cell string.

5. The control method as claimed in claim 1, further comprising steps of:

selecting one of the remaining memory blocks as a third memory block, wherein the third memory block is inactive when the first memory block is in the program mode or the read mode; and providing the ground voltage to the bit line of the third memory block and conducting the cell string of the third memory block, so that the ground voltage is transmitted from the bit line to the common source line of the substrate through the cell string.

6. A control method for a nonvolatile memory device with a vertically stacked structure, the nonvolatile memory device comprising a substrate, a common source line and plural memory blocks, the common source line being formed on the substrate, the plural memory blocks being disposed over the substrate, each memory block comprising a cell string connected between a bit line and the common source line, the control method comprising steps of:

providing a ground voltage to the bit line of at least one inactive memory block neighboring an active memory block and conducting the cell string of the inactive memory block to transmit the ground voltage from the bit line to the common source line of the substrate through the cell string of the inactive memory block;

wherein the active memory block is selected to program or read, and the inactive memory block is not used to program or read when the active memory block is programming or reading.

* * * * *